United States Patent
Kawashima et al.

(10) Patent No.: US 8,420,514 B2
(45) Date of Patent: Apr. 16, 2013

(54) EPITAXIAL SILICON WAFER AND METHOD FOR MANUFACTURING SAME

(75) Inventors: Tadashi Kawashima, Tokyo (JP); Masahiro Yoshikawa, Tokyo (JP); Akira Inoue, Tokyo (JP); Yoshiya Yoshida, Tokyo (JP); Kazuhiro Iriguchi, Tokyo (JP); Toshiyuki Isami, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/382,674

(22) PCT Filed: Jul. 1, 2010

(86) PCT No.: PCT/JP2010/061229
§ 371 (c)(1),
(2), (4) Date: Jan. 6, 2012

(87) PCT Pub. No.: WO2011/007678
PCT Pub. Date: Jan. 20, 2011

(65) Prior Publication Data
US 2012/0112319 A1 May 10, 2012

(30) Foreign Application Priority Data
Jul. 16, 2009 (JP) ................................. 2009-167623

(51) Int. Cl.
*H01L 29/36* (2006.01)
(52) U.S. Cl.
USPC .................................. 438/488; 257/E29.109
(58) Field of Classification Search .................. 438/488; 257/E29.109, 21.09
See application file for complete search history.

(56) References Cited

U.S. PATENT DOCUMENTS
5,789,308 A * 8/1998 DeBusk et al. .............. 438/476

FOREIGN PATENT DOCUMENTS

| JP | 9-7961 | 1/1997 |
|---|---|---|
| JP | 10-223641 | 8/1998 |
| JP | 2000-31153 | 1/2000 |
| JP | 2001-167995 | 6/2001 |
| JP | 2002-187797 | 7/2002 |
| JP | 2006-120939 | 5/2006 |
| JP | 2007-073594 | 3/2007 |
| JP | 2008-159976 | 7/2008 |
| WO | 2008/078404 | 7/2008 |

OTHER PUBLICATIONS

U.S. Appl. No. 13/378,562 to Tadashi Kawashima et al., filed Dec. 15, 2011.
"Gettering Processing Technique", Science in Silicon, Jun. 28, 2008, pp. 586-587, with English Translation.

* cited by examiner

*Primary Examiner* — Roy Potter
(74) *Attorney, Agent, or Firm* — Greenblum & Bernstein, P.L.C.

(57) ABSTRACT

It is an object to provide an epitaxial silicon wafer that is provided with an excellent gettering ability in which a polysilicon layer is formed on the rear face side of a silicon crystal substrate into which phosphorus (P) and germanium (Ge) have been doped. A PBS forming step for growing a polysilicon layer is executed on the rear face side of a silicon crystal substrate into which phosphorus and germanium have been doped at a high concentration to execute a baking treatment. After a surface layer of the silicon crystal substrate is then polished up to a predetermined amount, a silicon epitaxial layer is grown by a CVD method. By the above steps, the number of LPDs (caused by an SF) that occur on the surface of the epitaxial silicon wafer due to the SF can be greatly reduced.

7 Claims, 4 Drawing Sheets

EPITAXIAL SILICON WAFER AND METHOD FOR MANUFACTURING SAME

TECHNICAL FIELD

The present invention relates to an epitaxial silicon wafer that is used for a semiconductor circuit and a method for manufacturing the epitaxial silicon wafer. More specifically, the present invention relates to an epitaxial silicon wafer in which a polysilicon layer is formed on the rear face side of a silicon crystal substrate into which phosphorus has been doped as an n-type dopant for adjusting an electric resistivity and germanium has been doped and a silicon epitaxial layer is formed on the surface of the silicon crystal substrate and to a method for manufacturing the epitaxial silicon wafer.

BACKGROUND ART

For instance, an electric resistivity of a silicon crystal substrate must be extremely low in the case of an epitaxial silicon wafer for a power MOS transistor. In order to reduce an electric resistivity of a silicon crystal substrate to a satisfactory extent, arsenic (As) and antimony (Sb) are doped as an n-type dopant for adjusting a resistivity into molten silicon in a pulling step of a silicon crystal ingot that is a raw material of a wafer (that is, in growing a silicon crystal). The above technique is publicly known. However, since the above dopant is extremely easily vaporized, it is difficult to fully increase a dopant concentration in a silicon crystal, whereby it is difficult to manufacture a silicon crystal substrate that is provided with a low resistivity that is a required degree.

Consequently, a silicon crystal substrate into which phosphorus (P) has been doped at a high concentration as an n-type dopant that is provided with a characteristic of a low volatility and in which an electric resistivity is extremely low is being used.

However, in the case in which a silicon epitaxial layer is formed on a silicon crystal substrate into which phosphorus has been doped at a high concentration, a dislocation defect (a misfit dislocation) caused by a difference of a concentration of phosphorus at an interfacial part between a silicon crystal substrate and a silicon epitaxial layer occurs unfortunately. A misfit dislocation is propagated from an interfacial part of a silicon crystal substrate to a surface of a silicon epitaxial layer and is visually observed as a congestion of long and thin lines. The misfit dislocation results in a decrease in an electrical performance of a semiconductor device. A cause of the misfit dislocation is that an atomic radius of phosphorus is 1.10 A (angstrom) that is extremely smaller than an atomic radius of silicon which is 1.17 A, and a great difference between covalent radiuses of the both sides causes an unnecessary strain in a crystal. (Since an atomic radius of arsenic is 1.18 A that is fairly close to an atomic radius of silicon, a misfit dislocation less occurs.)

In order to solve the above problem, germanium (Ge) of which an atomic radius is 1.22 A that is larger than that of silicon is doped simultaneously with phosphorus in a pulling step of a silicon single crystal ingot. By this process, a strain of a silicon crystal lattice caused by phosphorus is relaxed by germanium and an occurrence of a misfit dislocation is suppressed (see Patent Literature 1).

An epitaxial growth occurs at a high temperature for an epitaxial wafer. Consequently, an oxygen precipitate (BMD) and an oxygen precipitation nucleus that has been formed in a crystal in a growing stage of a silicon single crystal ingot are extinguished by a high-temperature heat treatment, whereby a gettering ability is lower unfortunately.

As a gettering method as a countermeasure for resolving a gettering shortage, an IG (intrinsic gettering) method and an EG (extrinsic gettering) method are publicly known (see Non Patent Literature 1).

For instance, a technique for executing an oxygen precipitation nucleus formation heat treatment to a wafer to increase an oxygen precipitation nucleus density and for executing an epitaxial growth is publicly known (see Patent Literature 2).

Moreover, a technique for executing a poly back seal (PBS) method before an epitaxial growth treatment is publicly known (see Patent Literature 3 and Patent Literature 4). The poly back seal (PBS) method is an example of the EG method in which a polysilicon layer is formed on the rear face of a wafer and a strain field and a lattice mismatch that occur at an interface with a substrate are utilized.

CITATION LIST

Patent Literature

PTL 1: Japanese Patent Application Laid-Open Publication No. 9-7961
PTL 2: Japanese Patent Application Laid-Open Publication No. 10-223641
PTL 3: Japanese Patent Application Laid-Open Publication No. 2000-31153
PTL 4: Japanese Patent Application Laid-Open Publication No. 2001-167995

Non Patent Literature

NPL 1: UCS Semiconductor Infrastructure Technology Research Association, Science is Silicon, Realize Corporation, Jun. 28, 1996, P586-P587

SUMMARY OF INVENTION

Technical Problem

As shown in Patent Literature 1, in the case in which a silicon epitaxial layer is grown on a silicon crystal substrate into which phosphorus and germanium of a high concentration have been doped in growing a silicon crystal by a CVD (Chemical Vapor Deposition) method, the above misfit dislocation is prevented. However, the present inventors have found that another adverse reaction occurs newly by an experiment. The adverse reaction is that a stacking fault (hereafter referred to as an SF) occurs in a silicon epitaxial layer, the SF appears on a wafer surface as a step, and an LPD (Light Point Defect) level on a wafer surface is degraded. In particular, in the case in which a silicon epitaxial layer is grown after a poly back seal is carried out on a rear face side of a silicon crystal substrate, it is found that an LPD level on a wafer surface is degraded and the total number of LPDs caused by the SF is extremely large. For instance, the total number of LPDs caused by the SF (stacking fault) is several thousand or larger in some cases for an epitaxial silicon wafer having a diameter of 200 mm, whereby the epitaxial silicon wafer is off from practical use in some cases. A cause of the occurrence of the SF is not cleared as the case now stands. It is a unique problem in the case in which a silicon epitaxial layer is formed on a silicon crystal substrate into which phosphorus and germanium have been doped at a high concentration.

The present invention was made in consideration of the above problems, and an object of the present invention is to suppress both of an occurrence of a misfit dislocation and an occurrence of a stacking fault (SF) for an epitaxial silicon wafer in which a polysilicon layer has been formed on a rear face side of a silicon crystal substrate into which phosphorus (P) has been doped as an n-type dopant for adjusting an electric resistivity and germanium (Ge) has been doped as a base.

Solution of Problem

A method for manufacturing an epitaxial silicon wafer in accordance with a first aspect of the present invention is comprised of a first step of preparing a silicon crystal substrate into which phosphorus has been doped as an n-type dopant for adjusting an electric resistivity and germanium has been doped; a second step of generating a minute pit in a surface layer of the silicon crystal substrate by executing a baking treatment of the silicon crystal substrate; a third step of decreasing the minute pits that have been generated in the surface layer of the silicon crystal substrate by executing a polishing treatment of the surface layer of the silicon crystal substrate up to a predetermined amount; and a fourth step of forming a silicon epitaxial layer on the surface of the silicon crystal substrate after the polishing treatment.

The above manufacturing method can suppress an occurrence of a misfit dislocation that is a problem in the case in which a silicon epitaxial layer is formed on a silicon crystal substrate by the silicon crystal substrate into which phosphorus has been doped at a high concentration. In addition, a minute pit is generated in a surface layer of the silicon crystal substrate by design in a baking treatment and the minute pits are reduced by executing a polishing treatment. Consequently, in the case in which a silicon epitaxial layer is formed after that, an occurrence of an SF from a minute pit as an origin can be suppressed in an effective manner and the number of light point defects (LPDs) on the surface of the silicon epitaxial layer (the wafer surface) can be extremely reduced. For instance, a wafer in which the number of LPDs on the surface of the silicon epitaxial layer is equal to or less than 32 per surface area of 100 cm$^2$ (a wafer in which the total number of wafer LPDs is equal to or less than 100 in the case of a wafer having a diameter of 200 mm) can be manufactured For the above method for manufacturing an epitaxial silicon wafer, it is preferable that a phosphorus concentration of the silicon crystal substrate that is prepared in the first step is adjusted in a range of $4.7\times10^{19}$ to $9.47\times10^{19}$ atoms/cm$^3$ and a germanium concentration of the silicon crystal substrate is adjusted in a range of $7.0\times10^{19}$ to $1.0\times10^{20}$ atoms/cm$^3$. By adjusting a phosphorus concentration and a germanium concentration to be in the above concentration range, an occurrence of a misfit dislocation can be suppressed in an effective manner.

The above method for manufacturing an epitaxial silicon wafer can be further comprised of a fifth step of forming a polysilicon layer on the rear face side of the silicon crystal substrate between the first step and the second step. By the above manufacturing method, a sufficient gettering ability can be obtained. In the case in which the fifth step is executed, pits that rise up to the surface in the second step are increased in some cases. However, the pits can be cleared away by a polishing of a predetermined amount in the third step. Moreover, in the case in which a silicon epitaxial layer is formed, the number of LPDs that are generated on the surface of the silicon epitaxial layer (the wafer surface) can be extremely reduced.

For the above method for manufacturing an epitaxial silicon wafer, the predetermined amount can be a thickness larger than a depth of a pit that is generated or that is assumed to be generated on the surface of the silicon crystal substrate after the second step. By the above manufacturing method, the pits that rise up to the surface after the second step can be cleared away in an appropriate manner. Moreover, in the case in which a silicon epitaxial layer is formed, the number of LPDs that are generated on the surface of the silicon epitaxial layer (the wafer surface) can be extremely reduced.

For the above method for manufacturing an epitaxial silicon wafer, the predetermined amount can be a thickness in the range of 1 µm to 10 µm. By the above manufacturing method, the pits that rise up to the surface after the second step can be cleared away in an appropriate manner. Moreover, in the case in which a silicon epitaxial layer is formed, the number of LPDs that are generated on the surface of the silicon epitaxial layer (the wafer surface) can be extremely reduced.

The above method for manufacturing an epitaxial silicon wafer can be further comprised of a sixth step of executing a baking treatment of the silicon crystal substrate for the purpose of a cleanup of the surface of the silicon crystal substrate between the third step and the fourth step. By the above manufacturing method, a natural oxide film that has been formed on the surface of after a polishing treatment and a particle that has adhered can be removed in an appropriate manner.

For the above method for manufacturing an epitaxial silicon wafer, a silicon epitaxial layer can be formed on the silicon crystal substrate at a temperature in the range of 1000 to 1090° C. in the fourth step. By the above manufacturing method, an occurrence of an SF can be suppressed in an effective manner and the number of LPDs on the surface of the silicon epitaxial layer can be extremely reduced.

An epitaxial silicon wafer in accordance with a second aspect of the present invention is comprised of a silicon crystal substrate into which phosphorus has been doped as an n-type dopant for adjusting an electric resistivity in a concentration range of $4.7\times10^{19}$ to $9.47\times10^{19}$ atoms/cm$^3$ and germanium has been doped in a concentration range of $7.0\times10^{19}$ to $1.0\times10^{20}$ atoms/cm$^3$; a silicon epitaxial layer that is formed on the surface of the silicon crystal substrate; and a polysilicon layer that is formed on the rear face side of the silicon crystal substrate, wherein the number of light point defects on the surface of the silicon epitaxial layer is equal to or larger than 32 per surface area of 100 cm$^2$.

An epitaxial silicon wafer in accordance with the present invention cannot be manufactured by a manufacturing method in accordance with a conventional technique, and can be manufactured only by a manufacturing method in accordance with the present invention. In other words, a product of a silicon crystal substrate of an n-type that is provided with an extremely low electric resistivity has not been developed. In recent years, such a product has been required. Consequently, an epitaxial silicon wafer that is provided with a silicon epitaxial layer on a silicon crystal substrate into which phosphorus has been doped at a high concentration in growing a silicon crystal is required. Because of this, it is effective that germanium is doped at a high concentration in order to suppress an occurrence of a misfit dislocation. However, in the case in which a silicon epitaxial layer is formed on the silicon crystal substrate into which phosphorus and germanium have been doped at a high concentration, the present inventors found that a stacking fault occurs in an epitaxial layer and an LPD density is increased unfortunately. A technique for solving a problem of a stacking fault for an epitaxial silicon wafer into which phosphorus and germanium have been doped at a high concentration has not been developed. Consequently, an epitaxial silicon wafer in accordance with the present invention has not existed and has been newly invented by the present inventors.

DESCRIPTION OF EMBODIMENTS

A method for manufacturing an epitaxial silicon wafer in accordance with the present invention will be described below in detail with reference to the drawings.

For the conventional technique as described above, after a polysilicon layer is formed on the rear face side of a silicon crystal substrate into which phosphorus (P) and germanium (Ge) have been doped in growing a silicon crystal (in particular, phosphorus and germanium have been doped at a high concentration that can implement an extremely low electric resistivity that is required for a power MOS transistor) (after the poly back seal forming treatment (PBS forming treatment) method), a silicon epitaxial layer is grown on the surface of the silicon crystal substrate. In that case, a number of stacking faults (SF) is generated in the silicon epitaxial layer.

The present inventors have found that an SF that is generated after an epitaxial growth is generated from a minute pit (a minute depressed part) as an origin that exists on the wafer surface before an epitaxial growth (after baking) by a close investigation of the manufacturing steps of an epitaxial silicon wafer.

Figure 4:
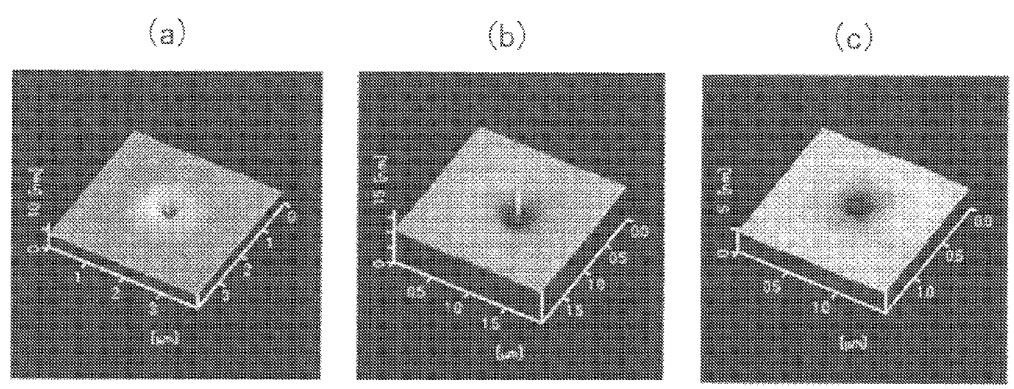
FIG. 4 is a view showing an appearance of a representative minute pit that has been observed on the surface of a silicon crystal substrate.

FIG. 4 is a view showing an appearance of a representative minute pit that has been observed on the surface of a silicon crystal substrate in the case in which a polysilicon layer is formed on the rear face side of a silicon crystal substrate into which phosphorus and germanium have been doped at a high concentration, a silicon wafer is baked in a hydrogen atmosphere as a pretreatment of an epitaxial growth, and the surface of the silicon crystal substrate is observed by using an atomic force microscope (AFM).

A size of a minute pit is 0.5 μm in a diameter and 5 nm in a depth for instance. Even in the case in which a baking treatment is executed to a silicon wafer to which boron (B) has been added as a p-type dopant at a high concentration and germanium has been added, the minute pit is not observed. Consequently, it is thought that phosphorus that has been doped into a crystal of a wafer at a high concentration is more likely to be involved in the minute pit.

For instance, it has been found that red phosphorus has a stimulating effect on a precipitation of oxygen. The poly back seal forming treatment is executed around 650° C. that is a temperature range in which an oxygen precipitation nucleus is formed in a silicon crystal. Consequently, minute oxygen precipitation nucleuses are formed in large quantity in a silicon crystal, and a minute pit is more likely to be formed from an oxygen precipitation nucleus as an origin in the case in which a high-temperature heat treatment of a baking treatment is applied. Moreover, a complex of an oxygen precipitate and germanium is formed (clustered), and germanium is sublimated at a comparatively low temperature. Consequently, in the case in which a high-temperature heat treatment of a baking treatment is applied, the complex is sublimed and protruded from the surface of a wafer, and it is thought that the complex part becomes a minute pit. However, it is not yet definite.

The present inventors have thought that an occurrence of an LPD in an epitaxial growth can be suppressed by clearing away a minute pit that rises up to the surface after a baking treatment before executing an epitaxial growth step. The present inventors have then found that an occurrence of an LPD in an epitaxial growth can be suppressed by clearing away a minute pit that rises up to the surface after a baking treatment based on an experiment.

Figure 1:
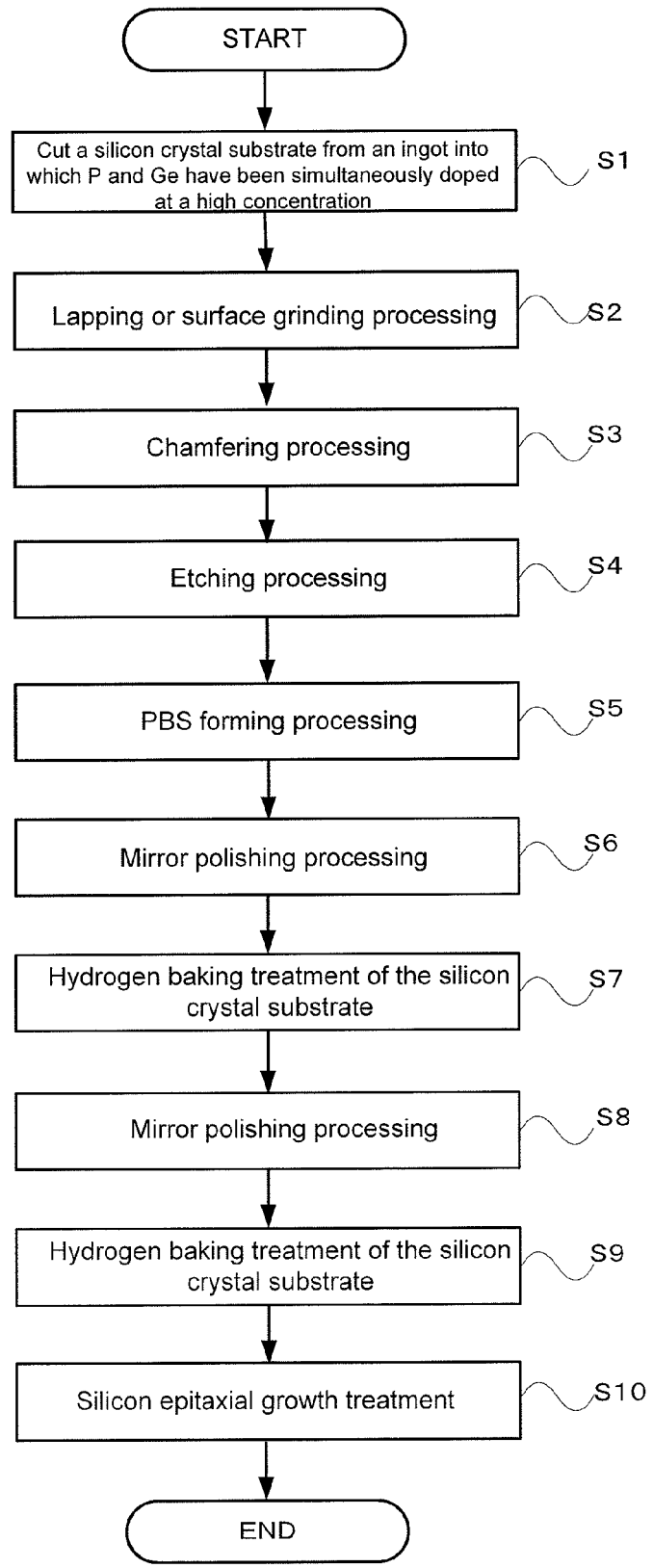
FIG. 1 is a flowchart showing a method for manufacturing an epitaxial silicon wafer in accordance with an embodiment of the present invention.

FIG. 1 is a view showing a method for manufacturing an epitaxial silicon wafer in accordance with an embodiment of the present invention.

In the first place, a silicon crystal substrate into which phosphorus and germanium have been doped simultaneously at a high concentration in growing a silicon crystal is prepared (step S1). One of the typical methods is that a silicon single crystal ingot into which phosphorus and germanium have been doped at a high concentration is pulled up by the Czochralski method from a molten silicon into which phosphorus and germanium have been doped at a high concentration and a silicon crystal substrate is fabricated from the silicon single crystal ingot by a heretofore known processing technique (cutting, grinding, polishing, cleaning, and etching).

It is preferable that a phosphorus concentration of the silicon crystal substrate is adjusted in a range of $4.7 \times 10^{19}$ to $9.47 \times 10^{19}$ atoms/cm$^3$ and a germanium concentration of the silicon crystal substrate is adjusted in a range of $7.0 \times 10^{19}$ to $1.0 \times 10^{20}$ atoms/cm$^3$. By adjusting a concentration of phosphorus and germanium in the case in which phosphorus and germanium are doped simultaneously into an original molten silicon from which an ingot is pulled up in a pulling process of a silicon ingot that is a raw material of a silicon crystal substrate, a silicon crystal substrate that contains phosphorus and germanium of a high concentration in the above range can be obtained. An electric resistivity of a silicon crystal substrate into which phosphorus and germanium of a high concentration in the above range have been doped is in the range of $0.8 \times 10^{-3}$ to $1.5 \times 10^{-3}$ Ω·cm. This electric resistivity satisfies a resistivity condition that is required for a wafer for a power MOS transistor. An effect of germanium that has been doped together with phosphorus can suppress an occurrence of a misfit dislocation in the case in which a silicon epitaxial layer is grown.

In the next place, a silicon crystal substrate is processed to be a constant size by executing a lapping or a surface grinding processing to the silicon crystal substrate that has been cut out (step S2), and a chamfering processing of the silicon crystal substrate is executed (step S3). A mirror polishing can also be executed to a part to which the chamfering processing has been executed (a chamfered part) after the chamfering processing of the silicon crystal substrate, and the step S3 can also be executed both before and after the step S2.

In the next place, an etching processing is executed in order to eliminate a damage of a mechanical work of the silicon crystal substrate (step S4). After the step, a mirror polishing processing can be executed to the surface (one surface or the both surfaces) of the silicon crystal substrate.

In the next place, a PBS forming step for growing a polysilicon layer is executed on the rear face side of the silicon crystal substrate (a face of the side on which a silicon epitaxial layer is not grown in the subsequent steps in the present embodiment) (step S5). The PBS forming step can be executed by the decompression chemical vapor deposition using a normal vertical reacting furnace for instance. For the PBS forming step, a source gas is SiH$_4$, a pressure is 26.66 pa, and a thickness of a film to be formed is equal to or larger than 0.1 μm for instance. It is preferable that the thickness of a film to be formed is equal to or less than 2 μm from the viewpoint of productivity. In the present embodiment, a polysilicon layer is formed on the entire surface of the silicon crystal substrate (a wafer) by the PBS forming step, and a polishing processing and an etching processing are executed to remove the polysilicon layer that has been formed on the surface of the wafer and a chamfered part of the wafer. By the above steps, a wafer is formed in which a polysilicon layer is formed on the rear face of the wafer.

In the next place, a mirror polishing processing is executed to the surface (one surface or the both surfaces) of the silicon crystal substrate (step S6).

In the next place, for the purpose of forming a minute pit in a surface layer of the silicon crystal substrate, a heat treatment (baking) is executed at a high temperature for a short time to the silicon crystal substrate (step S7). The baking treatment that is executed in this step is a heat treatment in which a minute pit can be formed in a surface layer of the silicon crystal substrate. For the conditions of the baking treatment, the heat treatment is executed for 30 to 300 seconds in a temperature range of 1110 to 1200° C. in an atmosphere of an inert gas such as a hydrogen gas and argon for instance. In the case in which a heat treatment temperature is low and a heat treatment time is short, an occurrence of a minute pit is insufficient. Even in the case in which minute pits that have been generated in an execution of the polishing treatment are tried to be reduced, there is a possibility that new minute pits are formed in a baking treatment (step S9) before an epitaxial growth treatment that is executed after that.

After the baking treatment, the polishing treatment is executed to reduce the minute pits that have been generated in a surface layer of the silicon crystal substrate (step S8). It is preferable that more minute pits, all minute pits if possible, are removed. A polishing amount (a polishing thickness: a polishing machining allowance) can preferably enable the number of pits that rise up to the surface in the silicon crystal substrate by the baking treatment to be reduced in the case in which the silicon crystal substrate is polished. For instance, it is preferable that the polishing amount is larger than a depth of a pit that rises up to the surface (or the polishing amount is larger than a depth of a pit that is assumed to rise up to the surface). More specifically, it is preferable that the polishing amount is equal to or larger than 5 nm that is assumed to be a depth of a pit. In the present embodiment, the polishing amount is in the range of 1 μm to 10 μm. It is also possible that the polishing amount is larger than 10 μm. However, in the case in which the polishing amount is increased too much, a polishing time becomes longer and an effect of a reduction of an LPD is degraded unfortunately. It is thought that a reason why an effect of a reduction of an LPD is degraded is that many of or all of layers of the silicon crystal substrate in which phosphorus and germanium are diffused outward are removed by the baking treatment.

In the next place, for the purpose of a cleanup of the surface of the silicon crystal substrate (a removal of a natural oxide film and a particle that have adhered to the surface of the silicon crystal substrate), a heat treatment (a baking treatment) is executed at a high temperature for a short time to the silicon crystal substrate (step S9). It is preferable that the baking treatment is executed in an atmosphere of an inert gas such as a hydrogen gas and argon in a temperature range of 1150 to 1200° C. and a baking time is equal to or larger than 35 seconds (for instance, 35 seconds at the shortest).

The minute pits that have been generated on a mandatory basis are reduced by the baking treatment (step S7) and the polishing treatment (step S8) that have been executed. This step enables to suppress forming of new pits in an effective manner in a subsequent baking treatment (step S9).

After the baking treatment, a treatment step for growing a silicon epitaxial layer on the silicon crystal substrate (an epitaxial growth step) is executed by a CVD method (step S10). It is preferable that a process temperature of the epitaxial growth step is in the range of 1000 to 1090° C., more preferably in the range of 1050 to 1080° C. A process temperature of 1000° C. or less is not practicable. A process temperature in such range causes a growth speed of a silicon epitaxial layer to be lowered and a quality of a silicon epitaxial layer to be degraded.

By the above manufacturing process, an epitaxial silicon wafer can be manufactured in which an electric resistivity of a silicon crystal substrate is extremely low in the range of 0.8×10$^{-3}$ to 1.5×10$^{-3}$ Ω·cm, a misfit dislocation of a silicon epitaxial layer is extremely less, and the number of LPDs caused by a stacking fault (an SF) is less. In the case in which an LPD of a particle size of 0.13 μm or larger is measured in a DCN mode of SP-1 manufactured by KLA-Tencor Corporation, epitaxial silicon wafers of 32 pieces or less per area of 100 cm$^2$ on a wafer surface (a surface of a silicon epitaxial layer) (100 pieces or less on the surface (314 cm$^2$) of a wafer of a diameter of 200 mm), preferably 0 to 3 pieces per area of 100 cm$^2$ on a wafer surface (10 pieces or less on the surface of a wafer of a diameter of 200 mm), which can be used as a power MOS transistor, is manufactured.

An epitaxial silicon wafer in which an electric resistivity of a silicon crystal substrate is extremely low and the number of LPDs caused by a stacking fault (an SF) is extremely less cannot be manufactured by a manufacturing method in accordance with a conventional technique, and can be newly manufactured only by a manufacturing method in accordance with the present invention.

Figure 2:
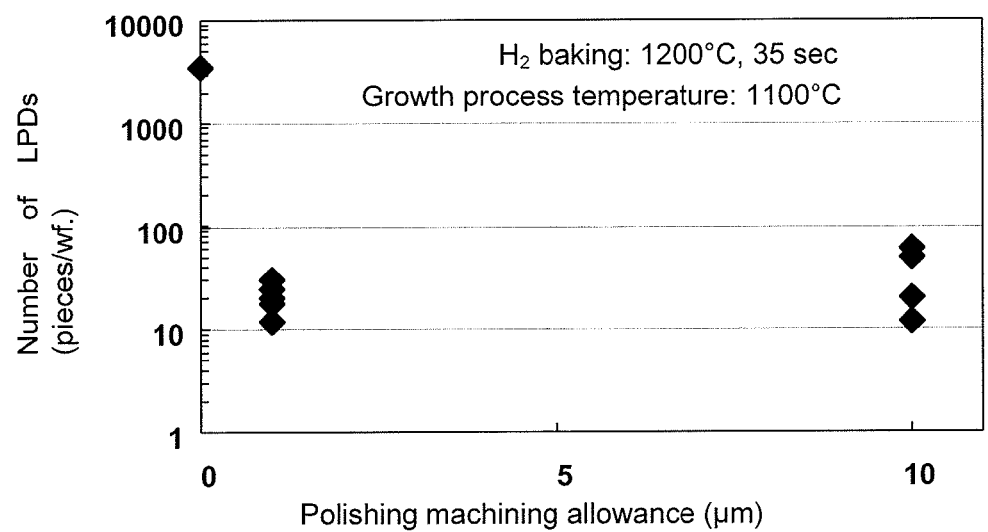
FIG. 2 is a view showing a relationship between a polishing machining allowance of a polishing treatment after a baking treatment in the method for manufacturing an epitaxial silicon wafer and the number of LPDs on a surface of a wafer.

FIG. 2 is a view showing a relationship between a polishing machining allowance of a polishing treatment after a baking treatment and the number of LPDs on a surface of a wafer in the case in which an epitaxial growth treatment is executed after that. In the figure, a horizontal axis indicates a polishing machining allowance of a polishing treatment after a baking treatment and a vertical axis indicates the number of LPDs per wafer.

The number of LPDs on the wafer surface per wafer indicated by the vertical axis was measured in a DCN mode of the particle counter SP-1 manufactured by KLA-Tencor Corporation. The shown number of LPDs is a result of a detection and a measurement of LPDs of a size of 0.13 μm or larger.

As shown in FIG. 2, in the case in which a polishing machining allowance is 0 μm, that is, in the case in which a polishing processing is not executed, the number of LPDs that are generated for a wafer after an epitaxial growth treatment is equal to or larger than 1000. However, in the case in which a polishing machining allowance is 1 μm, the number of LPDs that are generated in a wafer can be reduced to be 40 or less. Moreover, in the case in which a polishing machining allowance is 10 μm, the number of LPDs that are generated in a wafer can be reduced to be 100 or less (32 or less per area of 100 cm² on a wafer surface (a surface of a silicon epitaxial layer)).

Figure 3:
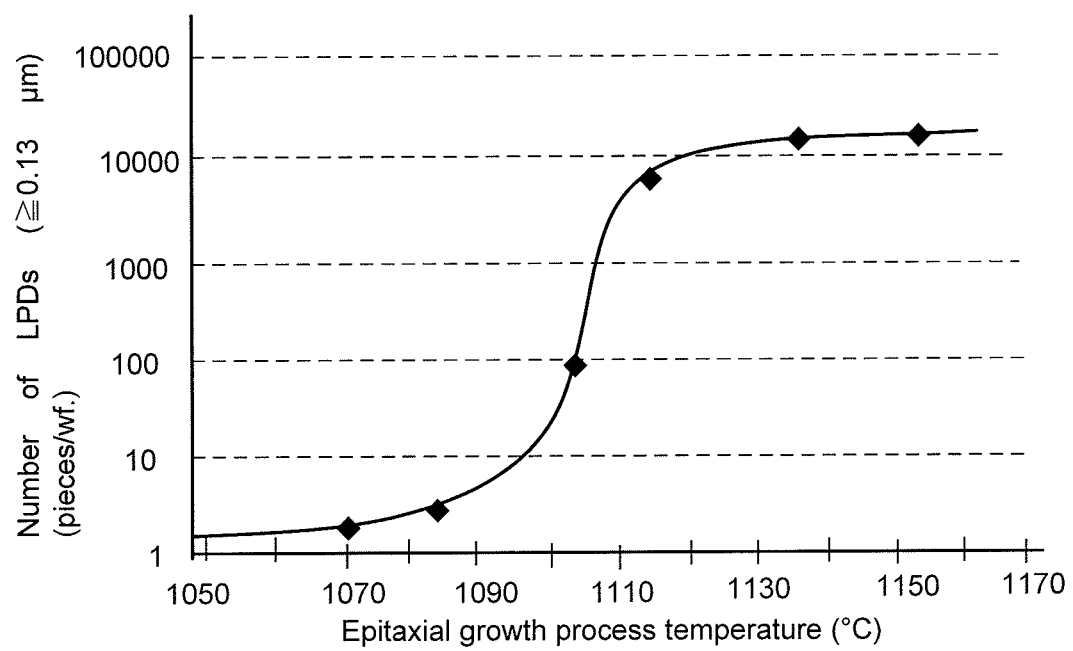
FIG. 3 is a view showing a relationship between a process temperature of an epitaxial growth step in accordance with an embodiment of the present invention and the number of LPDs on a surface of a wafer.

FIG. 3 is a view showing a relationship between a process temperature of an epitaxial growth step in accordance with an embodiment of the present invention and the number of LPDs on a surface of a wafer. FIG. 3 indicates a relationship between a process temperature of an epitaxial growth step and the number of LPDs that appear on a surface of a wafer due to an SF in an experiment in the case in which a process temperature of an epitaxial growth step (an epitaxial growth actual temperature) is varied. In the figure, a horizontal axis indicates a process temperature of an epitaxial growth step and a vertical axis indicates the number of LPDs on a wafer surface per wafer.

The number of LPDs per wafer indicated by the horizontal axis was measured in a DCN mode of SP-1 manufactured by KLA-Tencor Corporation. The shown number of LPDs is a result of a detection and a measurement of LPDs of a size of 0.13 μm or larger.

In the present experiment, a silicon crystal substrate of a diameter of 200 mm into which phosphorus and germanium have been simultaneously doped in the above range of a concentration in growing a silicon crystal was used. A polishing machining allowance in the polishing treatment (step S8) after the baking treatment was 1 μm. The silicon epitaxial layers were formed on 25 silicon crystal substrates for each process temperature. The number of LPDs at each process temperature shown in FIG. 3 is an average value of the number of LPDs of the 25 wafers.

As shown in FIG. 3, the range of process temperatures can be roughly classified into the range of 1110° C. or higher, the range of 1110 to 1090° C., and the range of 1090° C. or less (1000° C. or higher in this regard). In the range of 1110° C. or higher, the number of LPDs is extremely large to be 10000 or larger. In the case in which a process temperature is lowered, the number of LPDs is drastically reduced in the range of 1110 to 1090° C. In the range of 1100 to 1090° C., the number of LPDs is less to be 100 at the most (32 or less per area of 100 cm² on a wafer surface). Moreover, in the range of 1090° C. or less (1000° C. or higher in this regard), the number of LPDs is less to be 30 at the most (10 or less per area of 100 cm² on a wafer surface). Consequently, it is preferable that a process temperature in the epitaxial growth is 1100° C. or less, more preferably in the range of 1000 to 1090° C. In particular, in the range of 1050 to 1080° C., the number of LPDs is extremely less to be several pieces (2 to 0 per area of 100 cm² on a wafer surface) and the above problems in the case in which a process temperature is equal to or less than 1000° C. are less. Consequently, it is said that the range of 1050 to 1080° C. is the most suitable process temperature range.

While the preferred embodiments in accordance with the present invention have been described above, the range of the present invention is not restricted to the embodiments, and various changes, modifications, and functional additions can be thus made without departing from the scope of the present invention.

The invention claimed is:

1. A method for manufacturing an epitaxial silicon wafer, comprising:
   a first step of preparing a silicon crystal substrate into which phosphorus has been doped as an n-type dopant for adjusting an electric resistivity and germanium has been doped;
   a second step of generating a minute pit in a surface layer of the silicon crystal substrate by executing a baking treatment of the silicon crystal substrate;
   a third step of decreasing the minute pits that have been generated in the surface layer of the silicon crystal substrate by executing a polishing treatment of the surface layer of the silicon crystal substrate up to a predetermined amount; and
   a fourth step of forming a silicon epitaxial layer on the surface of the silicon crystal substrate after the polishing treatment.

2. A method for manufacturing an epitaxial silicon wafer according to claim 1, wherein a phosphorus concentration of the silicon crystal substrate that is prepared in the first step has been adjusted in a range of $4.7 \times 10^{19}$ to $9.47 \times 10^{19}$ atoms/cm³ and a germanium concentration of the silicon crystal substrate has been adjusted in a range of $7.0 \times 10^{19}$ to $1.0 \times 10^{20}$ atoms/cm³.

3. A method for manufacturing an epitaxial silicon wafer according to claim 1, further comprising:
   a fifth step of forming a polysilicon layer on the rear face side of the silicon crystal substrate between the first step and the second step.

4. A method for manufacturing an epitaxial silicon wafer according to claim 1, wherein the predetermined amount is a thickness equal to or larger than a depth of a pit that is generated or that is assumed to be generated on the surface of the silicon crystal substrate after the second step.

5. A method for manufacturing an epitaxial silicon wafer according to claim 1, wherein the predetermined amount is a thickness in the range of 1 μm to 10 μm.

6. A method for manufacturing an epitaxial silicon wafer according to claim 1, further comprising:
   a sixth step of executing a baking treatment of the silicon crystal substrate for the purpose of a cleanup of the surface of the silicon crystal substrate between the third step and the fourth step.

7. A method for manufacturing an epitaxial silicon wafer according to claim 1, wherein a silicon epitaxial layer is formed on the silicon crystal substrate at a temperature in the range of 1000 to 1090° C. in the fourth step.

* * * * *